United States Patent [19]
Small et al.

[11] Patent Number: 5,274,469
[45] Date of Patent: Dec. 28, 1993

[54] SAMPLE RATE CONVERTER CIRCUIT FOR IMAGE DATA

[75] Inventors: Jeffrey A. Small, Rochester; John J. Uebelacker, Spencerport, both of N.Y.

[73] Assignee: Eastman Kodak Company, Rochester, N.Y.

[21] Appl. No.: 810,405

[22] Filed: Dec. 23, 1991

[51] Int. Cl.$^5$ .......................... H04N 1/40; H04N 7/12
[52] U.S. Cl. .................................... 358/445; 358/448; 358/138
[58] Field of Search ............... 358/443, 445, 448, 425, 358/426, 133, 138; 341/61, 123

[56] References Cited

U.S. PATENT DOCUMENTS

| | | | |
|---|---|---|---|
| 4,106,053 | 8/1978 | Maxemchuk | 358/138 |
| 4,536,745 | 8/1985 | Yamaguchi et al. | 341/61 |
| 4,891,713 | 1/1990 | Mizukoshi et al. | 358/445 |
| 5,101,369 | 3/1992 | Torii et al. | 341/61 |
| 5,119,093 | 6/1992 | Vogt et al. | 341/123 |
| 5,159,339 | 10/1992 | Fujita | 341/61 |

OTHER PUBLICATIONS

Storage And Retrieval of Digitized Photographic Images, Eastman Kodak, U.S. Ser. No. 809,365.

Primary Examiner—Edward L. Coles, Sr.
Assistant Examiner—Thomas D. Lee
Attorney, Agent, or Firm—Raymond L. Owens

[57] ABSTRACT

The present invention is a sample rate converter in which a weighted filtering operation is performed. This operation stores a pixel stream in a random access memory (RAM) 30. During conversion pointers stored in counter 38 and register 40 are used to select the pixels from the RAM which are then multiplied by filter weights and accumulated. A counter 44 and mapping unit 46 select the weight being multiplied. The multiplication is performed by a lookup table read only memory (ROM) 32 that stores the results of the pixel-weight multiplication for all combinations of pixels and weights for each sample rate. An accumulator 33 stores the results of the multiplication until all multiplications have occurred at which point the filtered pixel is output. The output of the lookup table 32 is controlled by the pixel value, the coefficient selected and the table or map selected. The lookup table stores symmetric weights for as many conversion rates as desired. The mapping unit 46 maps a sequential coefficient count to a coefficient identifier which is non-sequential and symmetric allowing the size of ROM 32 to minimized and the number of address lines provided to the ROM 32 to be minimized.

6 Claims, 5 Drawing Sheets

SAMPLE RATE CONVERTER CIRCUIT FOR IMAGE DATA

BACKGROUND OF THE INVENTION

1. Field of the Invention

The present invention is directed to a sample rate converter for image data which is compact and low in cost and, more particularly, to a converter that directly converts a pixel stream to a different sample rate either higher or lower by filtering during which weights or filter coefficient are applied to pixels in the pixel stream using coefficient tables that are selected responsive to the desired conversion ratio.

2. Description of the Related Art

During the display of images produced by video compact discs such as produced by the Photo CD available from Eastman Kodak Co. the user occasionally desires to reduce the image displayed or magnify the image displayed for various reasons. The reduction and magnification can be performed by interpolating the pixel data. One method of interpolating the pixel image data, as illustrated in FIG. 1, is to perform sample rate conversion in the direction of an image line. The sample rate conversion is performed by oversampling a line of pixels H pixels in length by some integer factor N. Oversampling consists of inserting (N−1) additional pixels of value zero between every pixel in the input image line, resulting in a stream of NxH upsampled pixels. A convolutional filter is positioned at the beginning of the stream of upsampled pixels and used to sample the resulting stream of pixels to give a single output pixel. A convolutional filter generally consists of weighing values which are used in taking a weighted sum of the pixel stream, starting with the pixel which is under the first weighing value and continuing until there are no more weighing values. The convolutional filter is shifted forward in the stream of upsampled pixels by M pixels where M is the downsampling rate, and the next output pixel is then produced. The process is repeated until the filter no longer overlaps the upsampled pixel stream. The number of output pixels is then equal to N/M times the number of input pixels. An image results which has been scaled to the given dimension by a factor of N/M. One way to implement this method in hardware, as illustrated in FIG. 2, is to pass a stream of input data through a shift register 2 whose length is equal to the filter length, L. After each input pixel is shifted in, (N−1) zero values must be shifted in to accomplish the upsampling. Then, the output from each stage of the shift register 2 must pass through a corresponding one of a group 4 of multipliers to be multiplied by the corresponding filter weight from a corresponding one of a group of storages to storing the weights. The output of these multipliers is then added, via a cascade of adders 8, to produce and store an output pixel in a register 10 after every M shifts of upsampled data through the shift register. The zero stuffing and processing is controlled by a control unit 12. A filter of L taps needs L shift register stages, L multipliers and (L−1) adders. However, due to the precision required for intermediate results in this type of circuit and the long filter length commonly necessary for image data processing, this approach is impractical for an integrated circuit or for a low cost product because of the large amount of hardware needed.

SUMMARY OF THE INVENTION

It is an object of the present invention to produce a sample rate converter with a low number of components.

It is another object of the present invention to produce a sample rate converter that can be easily implemented on an integrated circuit.

It is a further object of the present invention to produce a sample rate converter in which the mathematical operations are reduced to a minimum.

It is also an object of the present invention to provide a converter that operates at high speed.

It is a further object of the present invention to perform a sample rate conversion directly without intermediate steps of upsampling and downsampling.

It is an object of the present invention to perform sample rate conversion without zero stuffing and zero processing.

The above objects can be attained by a sample rate converter that produces a converted pixel stream by filtering. During operation the converter stores a pixel stream in a data memory and during conversion pointers are used to select the pixels which are multiplied by filter coefficients and accumulated. The multiplication is performed by a lookup table that stores the results of the pixel-coefficient multiplication for all combinations of pixel values and coefficients for each sample rate conversion that the converter will perform. The output of the lookup table is controlled by the pixel data, the coefficient selected and the table selected. The accumulated output is the filtered image data.

These together with other objects and advantages which will be subsequently apparent, reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

Figure 3:
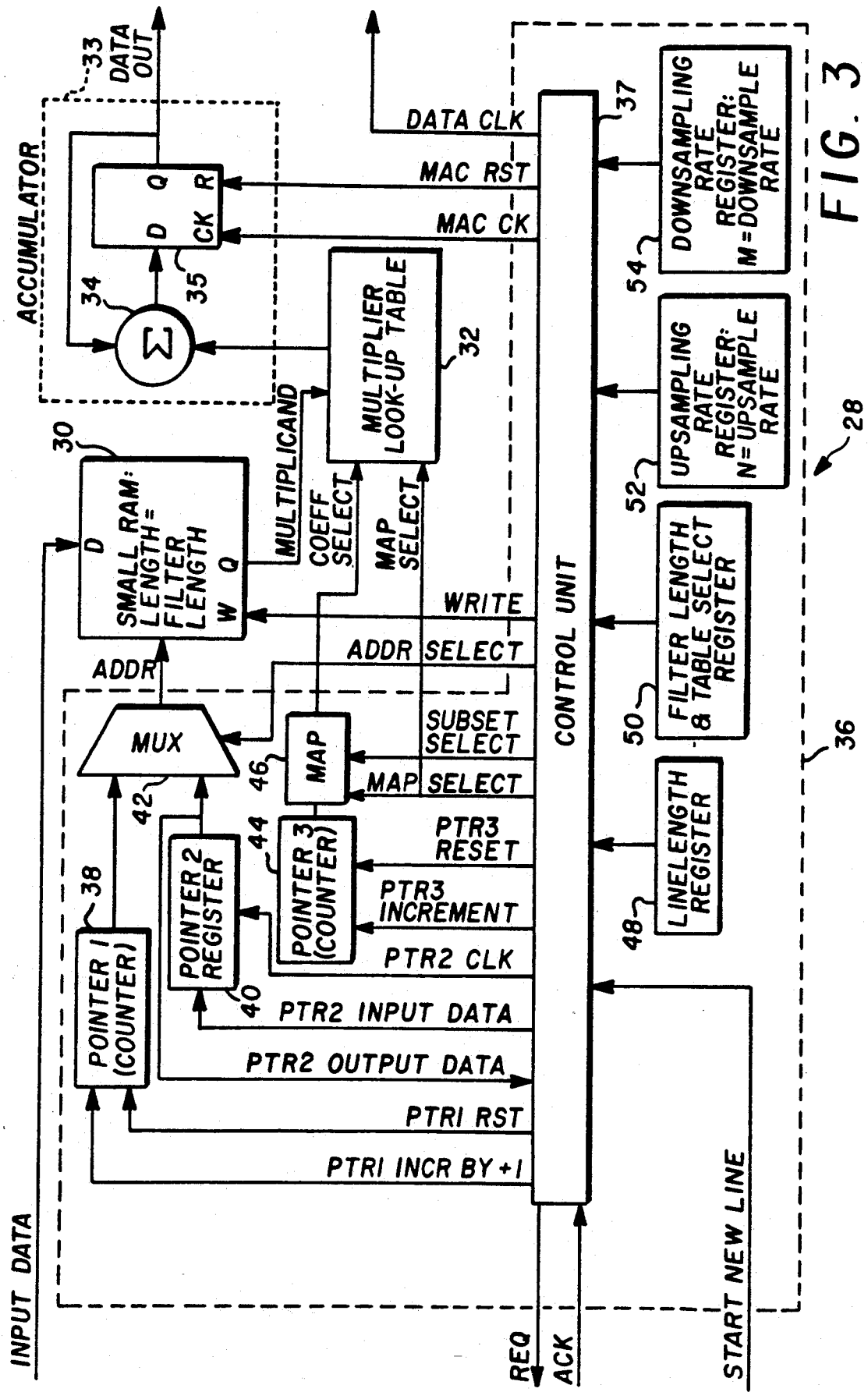
FIG. 3 illustrates an embodiment of the present invention.

The sample rate converter 28 of the present invention, as illustrated in FIG. 3, is designed as a finite impulse response filter which is particularly designed to perform one of three possible sample rate conversions responsive to a rate conversion selection by a user. The filter coefficients and how they were derived is described in U.S. application Ser. No. 809,365 filed Dec. 18, 1991 entitled Storage and Retrieval of Digital Photographic Images by Axman, Barry, Mathieu, Timmermans and Richards and incorporated by reference herein. The converter 30 particularly directly implements the following equations without upsampling and zero stuffing.

3 to 2 conversion
$$FP^0 = 1 \times PIX^{-6} - 4 \times PIX^{-5} - 11 \times PIX^{-4} - 3 \times PIX^{-3} + \quad (1)$$
$$24 \times PIX^{-2} + 55 \times PIX^{-1} + 68 \times PIX^0 + 55 \times PIX^{+1} +$$
$$24 \times PIX^{+2} - 3 \times PIX^{+3} - 11 \times PIX^{+4} - 4 \times PIX^{+5} +$$
$$1 \times PIX^{+6}$$

4 to 3 conversion
$$FP^0 = -4 \times PIX^{-7} - 8 \times PIX^{-6} - 8 \times PIX^{-5} + \quad (2)$$
$$0 \times PIX^{-4} + 19 \times PIX^{-3} + 40 \times PIX^{-2} + 57 \times PIX^{-1} +$$
$$64 \times PIX^0 + 57 \times PIX^{+1} + 40 \times PIX^{+2} + 19 \times PIX^{+3} +$$
$$0 \times PIX^{+4} - 8 \times PIX^{+5} - 8 \times PIX^{+6} - 4 \times PIX^{+7}$$

Figure 1:
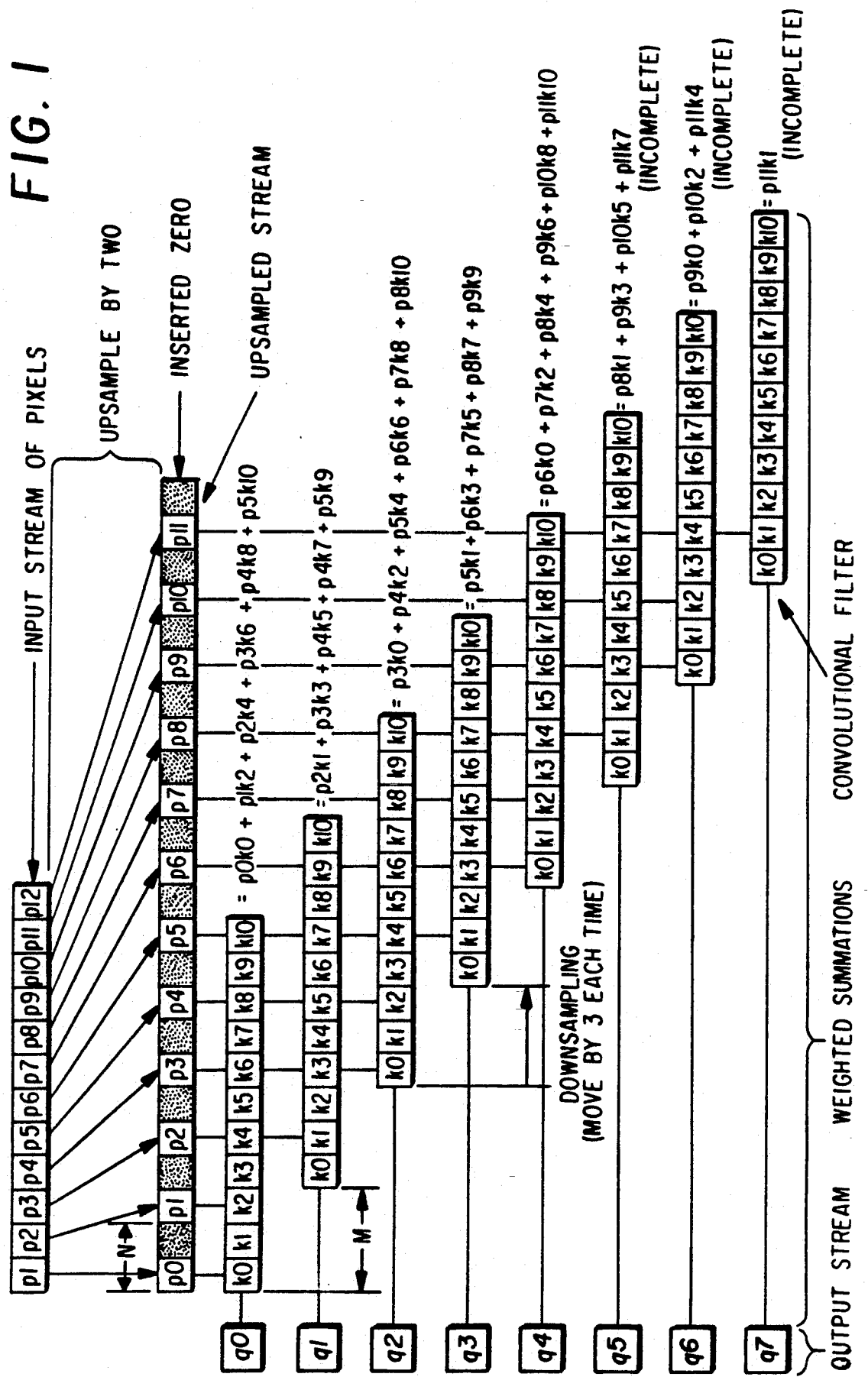
FIG. 1 illustrates a zero stuffing sample rate conversion.

2 to 3 conversion
$$FP^0 = 1 \times PIX^{-6} - 3 \times PIX^{-5} - 7 \times PIX^{-4} - \quad (3)$$
$$2 \times PIX^{-3} + 16 \times PIX^{-2} + 37 \times PIX^{-1} + 44 \times PIX^0 +$$
$$37 \times PIX^{+1} + 16 \times PIX^{+2} - 2 \times PIX^{+3} - 7 \times PIX^{+4} -$$
$$3 \times PIX^{+5} + 1 \times PIX^{+6}$$

where FP is the filtered pixel value, $PIX^0$ is the current pixel value for which the filtered/sample rate converted pixel FP is being produced, $PIX^{+n}$ is $n^{th}$ next pixel value, for example, if the current pixel being processed is p6 in FIG. 1 $PIX^{+3}$ is p9, and $PIX^{-n}$ is $n^{th}$ previous pixel value, for example, if the current pixel being processed is p6 $PIX^{-2}$ is p4. Note that the zero weight or coefficient in equation (2) does not need to be processed but for convenience of hardware design, so that a weight need not be skipped, it is processed.

The present invention 28, as illustrated in FIG. 3, has four major sections, a data memory 30 (a random access memory) which stores the incoming pixel data in a wrap around arrangement in which later pixels write over pixels that have been previously processed, a multiplier 32 which multiplies the filter coefficients of the selected equation times the corresponding pixels and an accumulator 33 which accumulates the filtered pixel output. The accumulator 33 includes a multiplier 34 and a storage register 35 comprising D-flip flops. The pixel data is selected and the multiplication is performed under the control of a control section 36 which includes a control unit 37 which increments counter 38 and register 40 which, along with a multiplexer 42 controlled by the control unit 37, select what pixel data or value to multiply. The control unit 37 controls the coefficient being multiplied by a counter 44 whose output maps through a map unit 46. The control unit 37 is controlled by registers 48-54 which specify the length of the image line being processed, the filter length and filter being used, the upsampling rate and the down sampling rate.

The architecture of FIG. 3 allows the sample rate conversion to be done directly, that is, rather than by intermediate steps of upsampling (zero stuffing) and downsampling (zero processing). In particular, no processing time or hardware is used for the writing, reading or processing of the zeros which would be introduced by the intermediate step of upsampling.

It may be seen that if zeros are not inserted one may still obtain the same weighted sums as in FIG. 1, since none of the zero terms contribute to the sums. For example, when upsampling by 2 and downsampling by 3 as shown in FIG. 1 with the set of weights or coefficients [$k_0$ to $k_{10}$], two different subsets of weights exist for the sums of successive input pixels. One subset is [$k_0$, $k_2$, $k_4$, $k_6$, $k_8$, $k_{10}$] and the other is [$k_1$, $k_3$, $k_5$, $k_7$, $k_9$]. In general, for an upsampling rate of N, there will be N distinct such subsets of weights. By periodically applying these subsets in the correct order to segments of the input pixel steam, the same resulting sums may be obtained as when the entire set is applied to the upsampled pixel stream. Such segments will in general overlap each other. Thus the insertion and subsequent processing of the zeros need not be performed.

In general, the jth subset is equal to [$k_j$, $K_{N+j}$, $k_{2N+j}$, ..., $k_{nN+j}$], where n is an integer incremented from 0 until (nN+j) is greater than (filter length−1), N is the upsampling rate and j is an integer from zero to (N−1). This eliminates those weights for upsampled pixels which would correspond to inserted zeros. For example in FIG. 1, N=2 and the filter length is 11, resulting in two such subsets:

$j=0$: [$k_0$, $k_2$, $k_4$, $k_6$, $k_8$, $k_{10}$]

$j=1$: [$k_1$, $k_3$, $k_5$, $k_7$, $k_9$]

The order in which these subsets are applied, and the offsets of the input segments to which these subsets are applied to obtain an output, are periodic and are uniquely determined by the selection of the effective upsampling rate, N, and the effective downsampling rate, M stored in registers 52 and 54 (FIG. 3), respectively. The period and the order in which the subsets of weights must be applied as new input pixels become available may be determined by constructing a diagram similar to FIG. 1 for the desired values of N and M. Then the output pixels may be written in terms of the weighted sums, from which the order of the subsets of weights may be directly determined. As an example, in FIG. 1, the subset for j=0 is applied to the input pixels starting at $p_0$, the subset for j=1 is applied to the input pixels starting at $p_2$, the subset for j=0 is applied for the input pixel segment starting at $p_3$, the subset for j=1 is applied for the input pixel subset starting at $p_5$, and so on.

Figure 5:
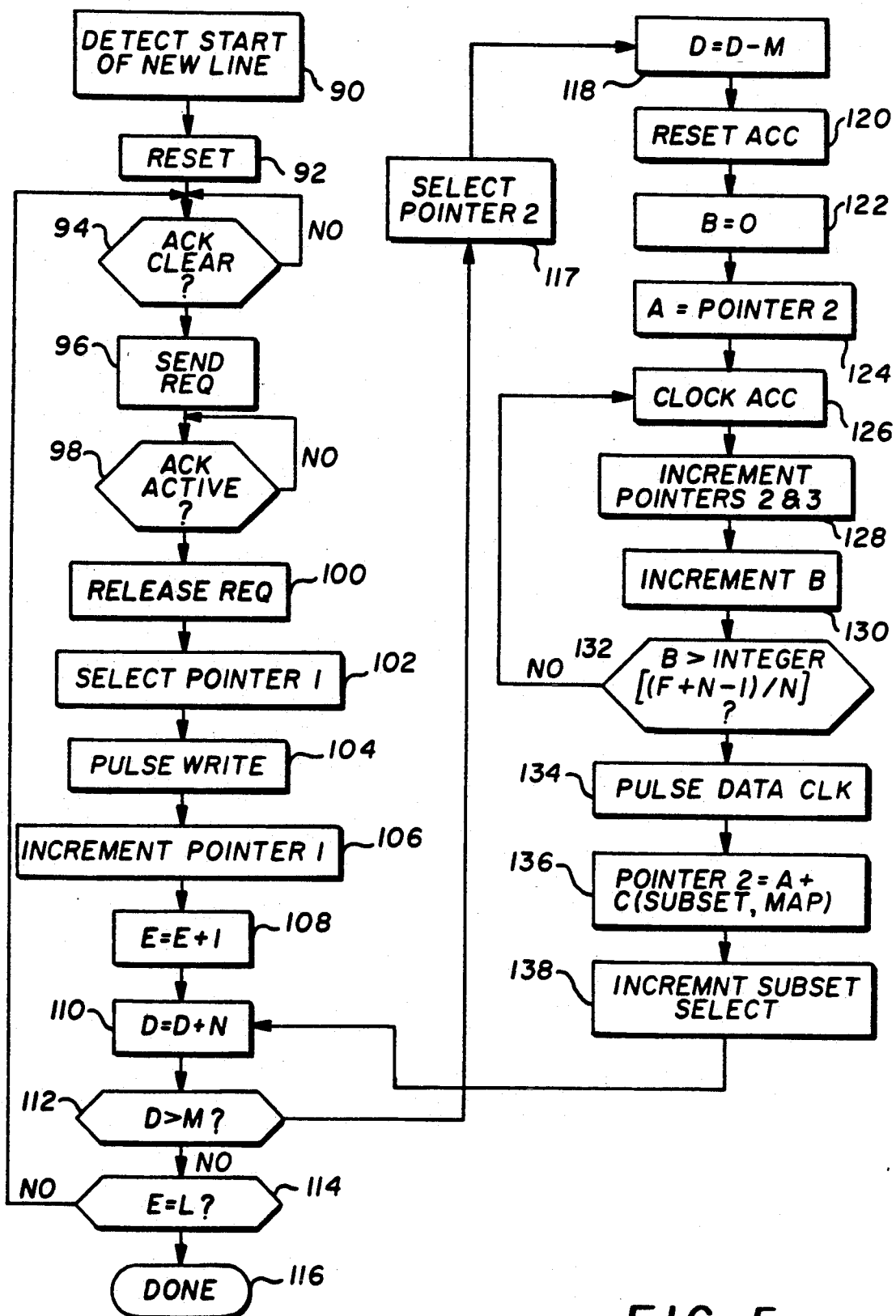
FIG. 5 illustrates the operations of the control unit 37 depicted in FIG. 3.

A control unit, such as unit 37, the operation of which is described in more detail in FIG. 5, may be designed for any such N and M which will select the proper subsets of weight for appropriate segments of input pixels. Thus, as input pixels are received the control unit 37 determines when there is sufficient information to calculate the next output pixel, selects the proper subset of weights, and directs the calculation of the appropriate weighted sums.

The order in which these subsets are applied to segments of the input pixel stream are controlled by the control unit 37 and several small counters 38 and 40 and a register 44 as shown in FIG. 3. The control unit 37 controls three pointers, P1, P2 and P3, which are all initialized to zero at the start of each line of input pixels. P1 and P2 point to the data memory RAM 30 while P3 points to a table of filter coefficients. As a new input pixel becomes available, the control unit 37 writes it into the RAM 30 at the location pointed to by P1 and then increments P1 by one.

For each increment of P1 which causes the integer portion of {N×(number of P1 iterations since the start of the line)/M} to increase, one or more output pixels are calculated. Thus, for example, if N=2 and M=3, then an output pixel will be calculated for increments of P1 numbered 0, 2, 3, 5, 6, 8, etc., since $(\frac{2}{3}) \times 0 = 0$, $(\frac{2}{3}) \times 1 = \frac{2}{3}$, $(\frac{2}{3}) \times 2 = 1 + \frac{1}{3}$, $(\frac{2}{3}) \times 3 = 2$, $(\frac{2}{3}) \times 4 = 2 + \frac{2}{3}$, $(\frac{2}{3}) \times 5 = 9 + \frac{1}{3}$, etc. The control unit is designed to select the proper subset of weights for each calculation as described in the previous paragraph. Each calculation is performed by positioning P2 at the beginning of the specific sequence of pixels for which a weighted sum is being taken, and P3 is positioned to the beginning of the required subset of weights.

At the beginning of a calculation the accumulator 33 is reset, then the value (pixel) pointed to by P2 in RAM 30 is read out and multiplied by the weight pointed to by P3 and added in the accumulator 33. P2 and P3 are then each incremented by one, the new memory location (pixel) in RAM 30 pointed to by P2 is then read out and the pixel is multiplied by the weight that P3 now points to, and the result is added to the accumulator 33. This process continues until the pointer P3 would be incremented past the last weight of the selected subset. The resulting "DATA OUT" value in the accumulator 33 is then clocked out by means of the "DATA CLK" line. As subsequent input pixels become available, the above process is repeated, generating a stream of output pixels until no more pixels are available from the input line of pixels. A look up table of weights stored in a memory and a hardware multiplier can provide the weights and perform the multiplication.

Figure 2:
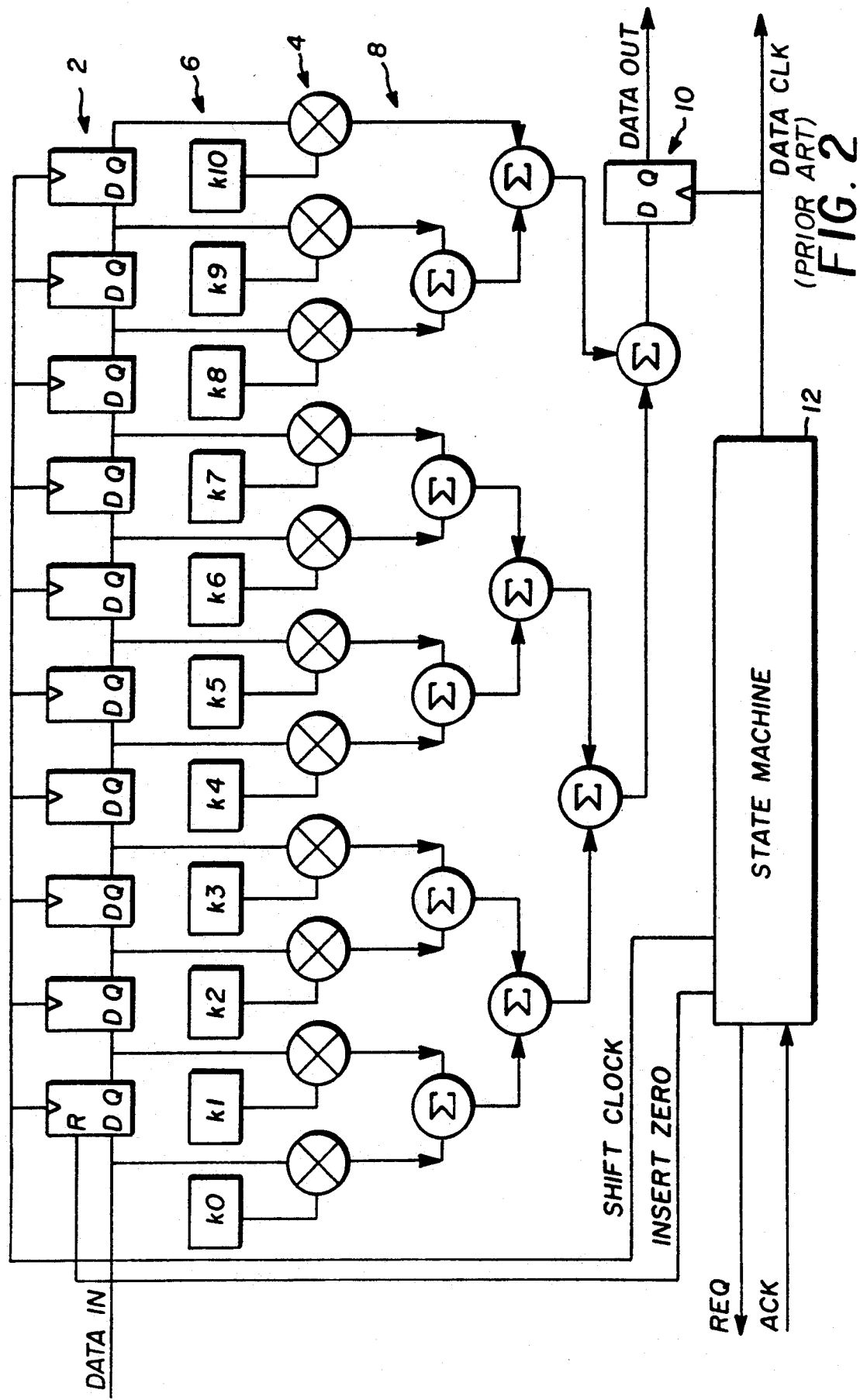
FIG. 2 illustrates hardware that will perform a zero stuffing conversion as shown in FIG. 1.

This method may require more clock cycles than the approach shown in FIGS. 1 and 2, because it is processing data serially rather than in parallel. For a line length of H, the following number of RAM 30 accesses is required:

1. H writes
2. $(L/N) \times (N/M) \times H = L \times (H/M)$ reads

For example: in a mode of operation in which $H=768$, $L=11$, $N=2$, and $M=3$ a total number of memory access cycles of $H + L \times (N/M) \times H = 3584$ is required which is an average of 4.666 accesses per input pixel. In many cases, the required throughput rate is low enough so that the extra accesses do not present a problem.

The weight multiplication rather than being performed by a combination of a memory and a hardware multiplier is preferably performed via a look-up table stored in a RAM or ROM (Read Only Memory) type of memory 32, as shown in FIG. 3. In this embodiment a portion of the memory address is the pointer P3, which serves to select a particular area of the memory which corresponds to a particular weight, and another portion of the address is the pixel value (multiplicand) to be multiplied. Thus, the portion of the memory 32 which corresponds to a particular weight consists of a look-up table whose entries are the product of the selected weight with the multiplicand value that is applied to the remaining address lines. Furthermore, additional address lines (map select) are preferably included to select different sets of weights since the present invention is designed to implement different filters for different sample rate conversions. If only a single conversion rate is to be implemented the address lines for the map (table) select are not necessary and the size of the memory 32 is correspondingly smaller. Also, the configuration of FIG. 3 is easy to change for different line lengths, sampling ratios and filter lengths, as the pertinent parameters are stored in easily accessed registers, and the weights can be easily changed by either changing the memory (by writing or by physical replacement) or by selecting different banks within the memory. In the embodiment of FIG. 3, different banks (different conversion rates) are chosen using additional address lines (SRC Table Select) while several sets of different parameters are selectable by means of several register bits. The details and requirements for memory 32 will be discussed in more detail with respect to FIG. 4.

A small RAM 30 may be used when P1 is designed to "wrap around" when it is incremented past the last location in the RAM 30. This RAM 30 must contain at least as many memory locations as there are weights in the filter. When P1 is incremented so that its value would exceed the last address of the RAM 30, the RAM size is subtracted from the pointer P1. In practice, the subtraction is never actually performed because the pointer length (the highest count of counter 38) is chosen to match the number of available addresses and the pointer P1 wraps around by default (or it is reset to zero) when an attempt is made to increment it past the last address of the RAM. P2 also behaves in this fashion.

For filters which have two or more identical weights, such as a symmetric filter (which is used for the sample rate conversion in the present invention), the size of the weight table (and the size of the weight times pixel table stored in memory 32) may be further reduced by passing P3 through a mapping process or mapping unit 46 as shown in FIG. 3, so that values of P3 which correspond to identical weights map to the same address in the weight table. As an example, if the desired weights for a particular filter were $[k_0$ to $k_{10}]$, where $k_0 = k_{10}$, $k_1 = k_9$, $k_2 = k_8$, $k_3 = k_7$, and $k_4 = k_6$, and these were split into the two subsets $[k_0, k_2, k_4, k_6, k_8, k_{10}]$ and $[k_1, k_3, k_5, k_7, k_9]$, as for the 2:3 example already described, only the weights $k_0$ to $k_5$ need be stored. The pointer P3 would be mapped so as to access these in the order: $[k_0, k_2, k_4, k_4, k_2, k_0]$ or $[k_1, k_3, k_5, k_3, k_1]$. In the case where the multiplication is done by the use of the look-up table 32, the reduction in the number of weights is especially advantageous.

The operation of mapping unit 46, which performs the conversion of the count in pointer counter 44 into the appropriate coefficient selection, is depicted in the truth tables set forth below.

TABLE 1

| | 2 UP/3 DOWN | | |
|---|---|---|---|
| MAP SELECT | SUBSET SELECT | POINTER 3 | COEFF SELECT |
| 0 | 0 | 0 | 0 |
| 0 | 0 | 1 | 2 |
| 0 | 0 | 2 | 4 |
| 0 | 0 | 3 | 4 |
| 0 | 0 | 4 | 2 |
| 0 | 0 | 5 | 0 |
| 0 | 0 | 6 | NULL |
| 0 | 0 | 7 | NULL |
| 0 | 1 | 0 | 1 |
| 0 | 1 | 1 | 3 |
| 0 | 1 | 2 | 5 |
| 0 | 1 | 3 | 3 |
| 0 | 1 | 4 | 1 |
| 0 | 1 | 5 | NULL |
| 0 | 1 | 6 | NULL |
| 0 | 1 | 7 | NULL |

TABLE 2

| | 3 UP/2 DOWN | | |
|---|---|---|---|
| MAP SELECT | SUBSET SELECT | POINTER 3 | COEFF SELECT |
| 1 | 0 | 0 | 0 |
| 1 | 0 | 1 | 3 |
| 1 | 0 | 2 | 6 |
| 1 | 0 | 3 | 9 |
| 1 | 0 | 4 | NULL |
| 1 | 0 | 5 | NULL |
| 1 | 0 | 6 | NULL |
| 1 | 0 | 7 | NULL |
| 1 | 1 | 0 | 1 |
| 1 | 1 | 1 | 4 |
| 1 | 1 | 2 | 7 |
| 1 | 1 | 3 | 10 |
| 1 | 1 | 4 | NULL |

TABLE 2-continued

| | 3 UP/2 DOWN | | |
|---|---|---|---|
| MAP SELECT | SUBSET SELECT | POINTER 3 | COEFF SELECT |
| 1 | 1 | 5 | NULL |
| 1 | 1 | 6 | NULL |
| 1 | 1 | 7 | NULL |
| 1 | 2 | 0 | 2 |
| 1 | 2 | 1 | 5 |
| 1 | 2 | 2 | 8 |
| 1 | 2 | 3 | NULL |
| 1 | 2 | 4 | NULL |
| 1 | 2 | 5 | NULL |
| 1 | 2 | 6 | NULL |
| 1 | 2 | 7 | NULL |

TABLE 3

| | 4 UP/3 DOWN | | |
|---|---|---|---|
| MAP SELECT | SUBSET SELECT | POINTER 3 | COEFF SELECT |
| 2 | 0 | 0 | 0 |
| 2 | 0 | 1 | 4 |
| 2 | 0 | 2 | 8 |
| 2 | 0 | 3 | 12 |
| 2 | 0 | 4 | NULL |
| 2 | 0 | 5 | NULL |
| 2 | 0 | 6 | NULL |
| 2 | 0 | 7 | NULL |
| 2 | 1 | 0 | 1 |
| 2 | 1 | 1 | 5 |
| 2 | 1 | 2 | 9 |
| 2 | 1 | 3 | 13 |
| 2 | 1 | 4 | NULL |
| 2 | 1 | 5 | NULL |
| 2 | 1 | 6 | NULL |
| 2 | 1 | 7 | NULL |
| 2 | 2 | 0 | 2 |
| 2 | 2 | 1 | 6 |
| 2 | 2 | 2 | 10 |
| 2 | 2 | 3 | 14 |
| 2 | 2 | 4 | NULL |
| 2 | 2 | 5 | NULL |
| 2 | 2 | 6 | NULL |
| 2 | 2 | 7 | NULL |
| 2 | 3 | 0 | 3 |
| 2 | 3 | 1 | 7 |
| 2 | 3 | 2 | 11 |
| 2 | 3 | 3 | NULL |
| 2 | 3 | 4 | NULL |
| 2 | 3 | 5 | NULL |
| 2 | 3 | 6 | NULL |
| 2 | 3 | 7 | NULL |

Figure 4:
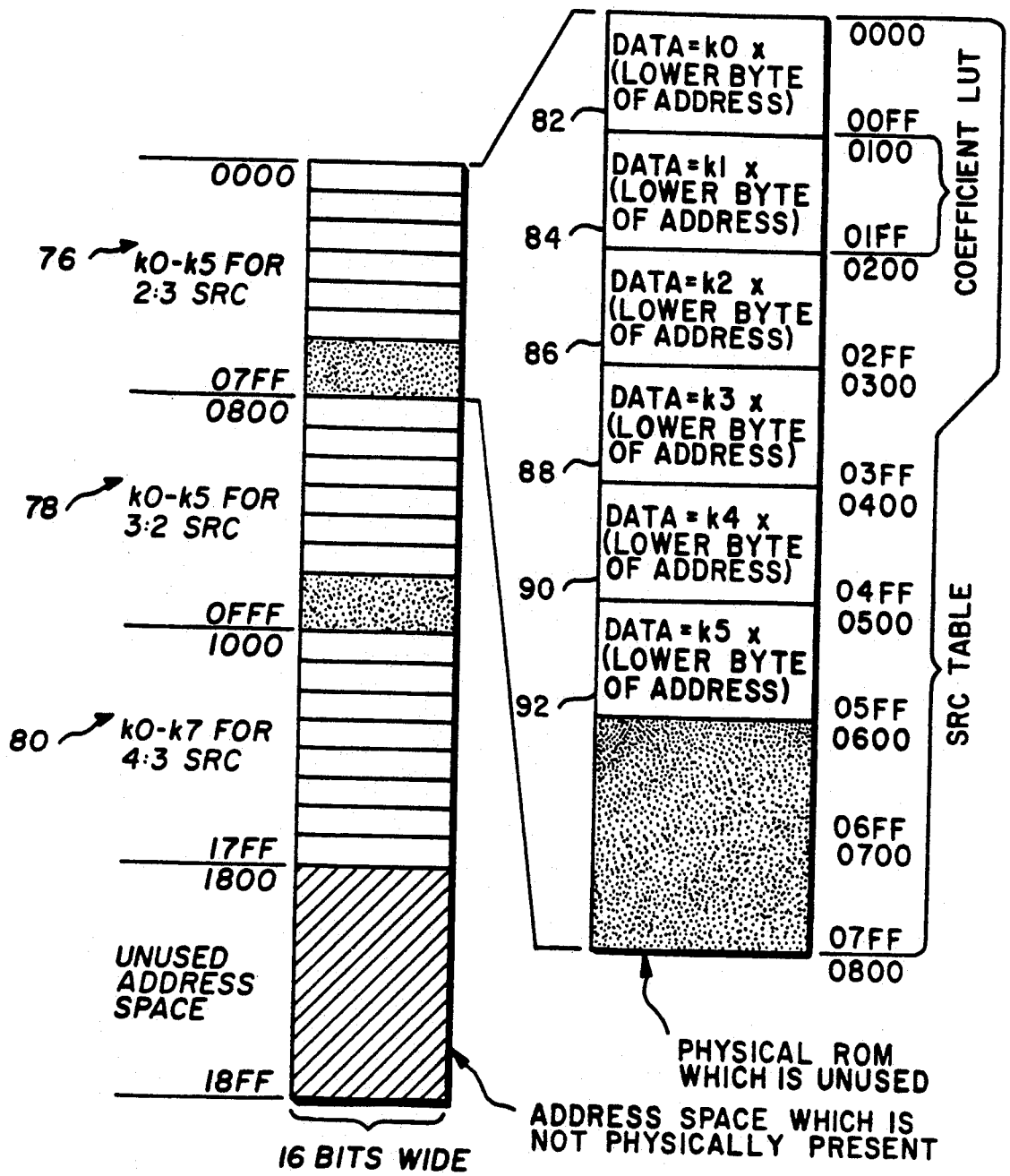
FIG. 4 illustrates the memory map of the memory 32.

The mapping unit 46 can be implemented as a look-up table in a memory, such as a ROM, in which the address inputs are map select, subset select and pointer 3 count and the output is coefficient address bits. For example, if the results of the multiplication of coefficient k1 times all possible pixel values are stored in a memory at addresses 0100 to 01FF (as shown in FIG. 4 to be discussed in detail later) the output of the ROM would be "1" when coefficient K1 is specified by the control unit 37 as the subset selection value. Correspondingly, if the k5 coefficient (weight) value is specified the coefficient output by the mapping ROM would be "5" allowing addresses 0500 to 05FF to be addressed. Note that when a "NULL" is the coefficient select output the RAM 32 outputs a value of zero requiring a null coefficient select to address a memory location storing a zero or otherwise hold the output of the memory 32 at zero. The mapping unit 46 could also be hardwired decode logic produced by a person of ordinary skill in the art from the look up tables 1-3 using a logic design tool such as Idea Station from Mentor Graphics.

The memory map of a look-up table used to perform the multiplication for the three different filters as set forth in equations 1-3 and which takes advantage of this symmetry and the address scheme is shown in FIG. 4. As can be seen in FIG. 4 the memory address includes two table or map select bits 70 which select the conversion ratio implemented, three coefficient or weight select bits 72 allowing up to eight coefficients or weights and eight bits 74 equalling the pixel value being multiplied. The content of memory 32 is divided into three tables 76, 78 and 80 corresponding to the particular conversion rate. Each of the tables is divided into sections 82-92 where each section is a table corresponding to the values of one of the coefficients times all possible pixel values. For example, section 86 includes all the output values for the coefficient k2 times all possible pixel values. When the pixel is 8 bits as illustrated in FIG. 4 each section occupies 256 eight bit bytes. Note the sections corresponding to coefficients k6 and k7, the 4 to 3 conversion, are not shown since that table 80 is not being shown in detail in FIG. 4.

The control unit 37 can be a conventional microprocessor with appropriate program and data storage or the unit 37 can be hardwired circuits which includes conventional counters, registers, comparators, adders and control logic, for example, a state machine. Hardwired circuits are preferably used when the invention is implemented as part of an integrated circuit since the space required for the hardwired circuits is less than that for a microprocessor. FIG. 5 illustrates the operations performed by the control unit 37 from which a person of ordinary skill in the art can program a microprocessor or design the hardwired circuits. When a start of a new line of pixels is detected 90, the control unit 37 exits from a wait or idle state and resets 92 or sets to zero the count in counters 38 and 44 and the count in register 40, loads the conversion ratio map or table selected value as designated by the contents of register 50 and sets the coefficient subset select value indicating what coefficient is to be processed to zero. The subset select value can be contained in a counter or in a register the contents of which can be incremented and the map select value can also be stored in a register. In addition, the contents of registers A, B, D and E, which will be discussed in more detail later, are reset to zero. The unit 37 then determines 94 whether the acknowledge (ACK) line is clear, sends 96 a request (REQ) when it is clear, waits unit ACK is again active and releases 100 REQ. The sequence of steps 94, 96, 98 and 100 are the conventional hand shaking that occurs when a new pixel value is available for processing. Once the handshaking is completed, the converter 28 is ready to begin processing a pixel value of the input pixel stream. The first step is to set the address select line of the multiplexer 42 to select 102 counter 38. The write line to RAM 30 is then pulsed 104 causing the first pixel value to be written into the first location of RAM 30. Next counter 38 is incremented 106 and the count stored in register E is incremented. The register E count counts the number of pixels input, so that the operation of the converter 28 can be suspended when all the pixels of the line have been input. The contents of register D is also incremented 110 by the upsampling rate N. Register D stores a value used to determine when enough pixel values have been input to produce an output pixel. Register D is incremented by N each time that a new input pixel is written into RAM 30. When the contents of register D are determined 112 to exceed the down sample rate M the contents of register D are decremented by M and the process of calculating the next output pixel is performed. Otherwise the number of input pixels stored in register E is tested 114 against the line length to determine whether to stop 116. If the end of the line of pixels has not been reached the handshaking operation occurs again and another input pixel value is stored.

When a sufficient number of new pixel values have been input to produce an output 112, pointer 2 is selected 117 by the multiplexer 42, the contents of register D are updated 118, the contents of accumulator 33 are reset 120 and the contents of register B are set 122 to zero. Register B stores the count of how many weights or coefficients within a particular subset of Weights have been used. Register A is loaded 124 with the value of pointer 2 stored in register 40. The accumulator 33 is then clocked 126 accumulating the result of the multiplication. Register 40 and counter 44 are then incremented (+1) 128 pointing to the next pixel value and coefficient to multiply. The coefficient count in register B is incremented 130 and the coefficient count is tested 132 to determine whether all weights have been processed and an output pixel value can be produced. If so, the data clock is pulsed 134. The value in pointer counter 40 is then updated 136. C is a value which is added to the old pointer value stored in register A to determine the next value of pointer 2. This "slides" the next subset of weights to properly align with the input pixel stream to calculate the next output pixel value. The C input can be produced from a look-up table stored in a ROM which has inputs of Map Select (i.e. sample rate conversion selection) and Subset Select lines. Next the subset select value is incremented (+1) 138 to point at the next set of coefficients. When this operation is finished, the control unit 37 increments 110 register D and continues as previously discussed.

The present invention results in much less hardware being required even when using discrete VLSI parts such as multipliers, adders and memory to perform a sample rate conversion. The circuit of the present invention is more flexible than the prior art, allowing the same set of hardware to perform different sample rate conversions, where parameters such as line length, filter length, sampling ratios, and filter weights may all be easily changed by writing new values to the various registers and/or memory shown in FIG. 3 without requiring reconfiguration of the hardware.

The many features and advantages of the invention are apparent from the detailed specification and thus it is intended by the appended claims to cover all such features and advantages of the invention which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A sample rate converter comprising:
   storage means including a random access memory for storing input data at a first sample rate,
   convolution filter means for directly filtering the input data to produce output data at a second sampling rate, wherein said filter means includes;
   a filter coefficient storage outputting filter coefficients corresponding to the input data and for each sample conversion rate, and
   a multiplier connected to said storage means and multiplying the input data times the filter coefficients;
   an accumulator connected to said multiplier and accumulating the coefficient multiplied input data, and
   multiplication storage means connected to said memory for storing all combinations of pixel values time filter coefficients for each sample conversion rate, and
   an accumulator connected to said storage means, further comprising a control unit connected to said memory and said filter means, said control unit includes;
   a multiplexer selecting between memory pointers for said memory;
   first and second pointer counters connected to said multiplexer;
   a third pointer counter connected to said multiplication storage; and
   a control unit connected to said storage means, said filter means and said pointer counters.

2. A converter as recited in claim 1, further comprising mapping means, connected between said third pointer counter and said multiplication storage, for converting a sequential count to a non-sequential coefficient selection.

3. A converter as recited in claim 2, wherein said mapping means converts a sequential count, a coefficient subset selection and a sample rate conversion map selection into the non-sequential coefficient selection.

4. A converter as recited in claim 3, wherein said mapping means comprises one of a ROM look-up table and decode logic.

5. A converter as recited in claim 1, wherein filter coefficients are symmetric and said multiplication storage comprises a memory divided into tables corresponding to sample rate conversions and each table being divided into coefficient sections storing the pixel values times a corresponding symmetric filter coefficient.

6. A sample rate converter for converting input pixel values input at a first rate to output pixel values produced at a second rate, said converter comprising:
   a random access memory storing the input data;
   a multiplexer connected to said random access memory;
   a first counter connected to said multiplexer and controlling storage of the input pixel values into said random access memory;
   a register connected to said multiplexer and controlling output of the input pixel values to produce the output pixel values;
   a read only memory connected to said random access memory and storing pixel values times filter coefficient values;
   a mapping unit connected to said read only memory and producing a coefficient selection value;
   a counter connected to said mapping unit and controlling production of the coefficient selection value; and
   an accumulator connected to said read only memory and producing the output pixel values.

* * * * *